(12) United States Patent
Nagakawa

(10) Patent No.: US 6,222,586 B1
(45) Date of Patent: Apr. 24, 2001

(54) SOLID-STATE IMAGING DEVICE HAVING PARTIALLY COVERED CONVERSION REGION, AND METHOD FOR PRODUCING AND METHOD FOR DRIVING THE SAME

(75) Inventor: Tadashi Nagakawa, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 08/928,916

(22) Filed: Sep. 12, 1997

(30) Foreign Application Priority Data

Sep. 12, 1996 (JP) .................................................. 8-241467
Sep. 9, 1997 (JP) .................................................. 9-244362

(51) Int. Cl.[7] .................................................. H04N 5/335
(52) U.S. Cl. .................................................. 348/311; 348/316
(58) Field of Search .................................................. 348/294, 302, 348/303, 311, 315, 316, 317, 318, 319, 320, 321; 357/23.1, 24, 60; 438/144, 142; 257/232, 233; H04N 5/335

(56) References Cited

U.S. PATENT DOCUMENTS

| | | | |
|---|---|---|---|
| 4,622,567 | * 11/1986 | Pals et al. | ............................ 357/23.1 |
| 5,040,038 | * 8/1991 | Yutani et al. | ............................ 357/24 |
| 5,313,081 | * 5/1994 | Yamada | ................................. 257/232 |
| 5,943,095 | * 8/1999 | Nakashiba | .............................. 348/311 |

FOREIGN PATENT DOCUMENTS 4-76952   3/1992   (JP).

OTHER PUBLICATIONS

T. Okutani et al., *1995 ITE Annual Convention*, 1995, pp. 93–94.
K. Nakashima et al., *ITE Technical Report*, 1994, vol. 18, No. 67, pp. 7–12.
Korean Office Action of Feb. 28, 2000 with English translation (citing the above–indentified reference BA).

* cited by examiner

*Primary Examiner*—Tuan Ho
(74) *Attorney, Agent, or Firm*—Dike, Bronstein, Roberts & Cushman; David G. Conlin; George W. Neuner

(57) ABSTRACT

A solid-state imaging device has a progressive-scan structure and includes, in a unit pixel area of a semiconductor substrate, a photoelectric conversion region and a vertical transfer CCD region for reading and transferring a signal charge stored in the photoelectric conversion region by performing four-phase driving using two vertical transfer electrodes each having a two-layer structure formed over the semiconductor substrate with a gate insulation layer disposed therebetween. Among the two vertical transfer electrodes each having a two-layer structure, lead parts of one vertical transfer electrode having the two-layer structure are positioned on the photoelectric conversion region in the unit area.

7 Claims, 12 Drawing Sheets

SOLID-STATE IMAGING DEVICE HAVING PARTIALLY COVERED CONVERSION REGION, AND METHOD FOR PRODUCING AND METHOD FOR DRIVING THE SAME

BACKGROUND OF THE INVENTION

1. Field of the Invention

The present invention relates to a progressive-scan CCD solid-state imaging device, a method for producing the same, and a method for driving the same.

2. Description of the Related Art

Recently, CCD solid-state imaging devices have been widely used in multimedia-related devices such as electronic still cameras and image input devices for personal computers as well as video cameras. A conventional CCD solid-state imaging device for a video camera employs a field integration mode system in order to obtain a video signal conforming to 2:1 interlaced scanning used for the TV broadcasting system. According to the field integration mode system, signal charges in two adjacent vertical lines are mixed together, and a combination of the two vertical lines is switched between a first field and a second field.

A progressive-scan CCD solid-state imaging device reads signal charges in two vertical lines independently without mixing the charges thereof, and thus can realize both a high resolution of moving pictures and a high vertical resolution. Moreover, a progressive-scan CCD solid-state imaging device employs a non-interlaced scanning system with no 2:1 interlaced scanning. An image obtained by such an imaging device is relatively easily converted into an image used in personal computers.

In order to realize the progressive-scan system, it is required to form a vertical transfer CCD region for transferring one bit of data within a vertical pixel pitch (Lv) and then transfer and output a signal charge read from a photoelectric conversion region in a unit pixel area without being mixed with any signal charges read from any adjacent unit pixel areas.

For an imaging section of such a progressive-scan CCD solid-state imaging device, three structures described below, for example, have been proposed.

(1) The vertical transfer CCD region has a two-layer gate structure driven by a two-phase driving system (FIGS. 9A, 10A and 11A).

(2) The vertical transfer CCD region has a three-layer gate structure driven by a three-phase driving system (FIGS. 9B, 10B and 11B).

(3) The vertical transfer CCD region has a three-layer gate structure driven by a four-phase driving system (FIGS. 9C, 10C and 11C).

FIGS. 9A, 9B and 9C are each structural views of a part of the imaging section corresponding to two pixel areas of the CCD solid-state imaging device having the respective structure described above. FIGS. 10A, 10B and 10C are each cross-sectional views of a lead part of the vertical transfer electrode in each pixel area wherein the lead part is provided. FIGS. 11A, 11B and 11C are diagrams illustrating a potential profile in the vertical transfer CCD region of the pixel areas respectively shown in FIGS. 9A, 9B and 9C, obtained when the charges are transferred. In FIGS. 9A, 9B, 9C, 10A, 10B, 10C, 11A, 11B and 11C, symbols $\phi_{v1}$, $\phi_{v2}$, $\phi_{v3}$ and $\phi_{v4}$ represent vertical transfer electrodes. Reference numeral 31 represents a p-well layer, reference numerals 32a and 32b each represent a photoelectric conversion region, and reference numeral 33 represents a vertical transfer CCD region. Reference numeral 34 represents a lead part of a vertical transfer electrode provided. Reference numeral 35 represents a potential barrier for determining the transfer direction, and reference numeral 36 represents a signal charge. Symbol Lv represents a vertical pixel pitch of a unit pixel area.

T. Okutani et al., "A ⅓-inch 330k Square-Pixel Progressive-Scan IT-CCD Image Sensor", ITE'95: 1995 ITE Annual Convention, pp. 93 and 94 discloses the structure shown in FIGS. 9B and 10B of the three-phase driving system and the structure shown in FIGS. 9C and 10C of the four-phase driving system. In addition, K. Nanashima et al., "A ½-inch 330K Progressive-Scan CCD Image Sensor with Square-Pixel", ITE Technical Report Vol. 18, No. 67, pp. 7–12 discloses a CCD imaging device of a three-phase driving system.

The conventional progressive-scan CCD solid-state imaging devices having the above-described structures, in which a part of a vertical transfer CCD region 33 which is included in one pixel area corresponds to one bit, have the following problems.

According to the structure shown in FIGS. 9A and 10A, a progressive scan is performed with the two-layer gate structure. A signal charge storage area and a potential barrier 35 for separating the charges are both formed below one electrode. In such a system, the potential barrier 35 cannot be formed in a self-aligned manner.

In the case where the potential barrier 35 is located below another vertical transfer electrode, a barrier or a dip is formed which impedes vertical transfer and tends to cause a charge transfer error. Moreover, as shown in FIG. 11A, the length of the signal charge storage area for each pixel area is shorter than Lv/2 by the length of the potential barrier 35 for separating the signal charges provided in the vertical transfer CCD region 33.

According to the structure shown in FIGS. 9B and 10B, in which the vertical transfer CCD region 33 has a three-layer structure, a clock pulse is applied to each of the vertical transfer electrodes $\phi_{v1}$, $\phi_{v2}$ and $\phi_{v3}$ in the respective layers (referred to as the "vertical three-phase driving system"). Such a three-layer gate structure has the drawbacks of a longer and more complicated production process compared to the two-layer structure and an excessively large stepped part on the surface of the pixel section as is apparent from FIG. 10, which shows a vertical cross-sectional view of the photoelectric conversion regions 32a and 32b. Moreover, as shown in FIG. 11B, the length of the area where signal charges can be stored for each pixel area is as short as Lv/3.

According to the structure shown in FIGS. 9C and 10C, the four-phase driving system is employed with a three-layer gate structure. Charges can be stored in two out of four phases, and thus the length of the signal charge storage area can be Lv/2 as shown in FIG. 11C. However, this structure also has the drawbacks of a long and complicated production process and an excessively large stepped part on the surface of the pixel section. Such an excessively large stepped part on the surface is disadvantageous for size reduction of the CCD solid-state imaging device. Specifically, when a microlens is formed to improve the sensitivity, such a large stepped part makes it more difficult to smooth the surface.

SUMMARY OF THE INVENTION

According to one aspect of the present invention, a solid-state imaging device has a progressive-scan structure and includes, in a unit pixel area of a semiconductor substrate, a photoelectric conversion region and a vertical transfer CCD region for reading and transferring a signal charge stored in the photoelectric conversion region by performing four-phase driving using two vertical transfer electrodes each having a two-layer structure formed over the semiconductor substrate with a gate insulation layer disposed therebetween. Among the two vertical transfer electrodes each having a two-layer structure, lead parts of one vertical transfer electrode having the two-layer structure are positioned on the photoelectric conversion region in the unit area.

By such a structure, first through fourth electrodes corresponding to one bit of the vertical transfer CCD for performing four-phase driving can be located within a unit pixel pitch in the vertical direction.

Although the photoelectric conversion region appears to be divided by the lead parts of one of the two vertical transfer electrodes, each having two-layer electrodes, the signal charges stored in the photoelectric conversion region are added at the time of reading of the charge to the vertical transfer CCD section or after the reading of the charge to the vertical transfer CCD section. As a result, a progressive-scan reading operation can be realized by which the signal charges stored in the photoelectric conversion region in a unit pixel area are transferred and output without being mixed with the signal charges stored in the photoelectric conversion regions in vertically adjacent pixel areas.

In one embodiment of the invention, a part covered by the lead part of the vertical transfer electrode positioned on the photoelectric conversion region is formed to have an opposite conductivity type to the conductivity type of an impurity layer which is not covered by the lead part of the electrode.

In one embodiment of the invention, a light blocking layer is formed periodically over at least one of the two vertical transfer electrodes each having the two-layer structure in the unit pixel area.

According to another aspect of the invention, a method for producing the solid-state imaging device includes the steps of forming a vertical transfer CCD region, an isolation region and a gate insulation layer in a semiconductor substrate, and then forming a photoelectric conversion region by performing ion implantation with an impurity having an opposite conductivity type to the conductivity type of the semiconductor substrate selectively into an area to be the photoelectric conversion region at a prescribed dose; forming a first-layer vertical transfer electrode including a lead part so that the lead part covers a part of the photoelectric conversion region; and forming a second-layer vertical transfer electrode above the lead part of the first-layer vertical transfer electrode after forming an insulation layer over the entire surface of the semiconductor substrate.

According to still another aspect of the invention, a method for producing the solid-state imaging device includes the steps of forming a vertical transfer CCD region, an isolation region and a gate insulation layer in a semiconductor substrate, and then forming a first-layer vertical transfer electrode covering a part of an area to be a photoelectric conversion region; forming a lead part of a second-layer vertical transfer electrode above the lead part of the first-layer vertical transfer electrode after forming an insulation layer over the entire surface of the semiconductor substrate; and forming a photoelectric conversion region by performing ion implantation with an impurity having an opposite conductivity type to the conductivity type of the semiconductor substrate at a prescribed dose using the lead part of the first-layer vertical transfer electrode and the lead part of the second-layer vertical transfer electrode as a mask.

According to still another aspect of the invention, a method for producing the solid-state imaging device includes the steps of forming a vertical transfer CCD region, an isolation region and a gate insulation layer in a semiconductor substrate, then forming a resist pattern so that the location of an end thereof is closer to a first area than the location of a border between the first area to be a photoelectric conversion region and a second area where a first-layer vertical transfer electrode is to be formed so that the resist pattern covers the entirety of the second area, and forming a first impurity region by performing ion implantation with an impurity having an opposite conductivity type to the conductivity type of the semiconductor substrate at a prescribed dose using the resist pattern as a mask; forming a first-layer vertical transfer electrode including a lead part so that the lead part covers a part of the photoelectric conversion region, and then forming a lead part of a second-layer vertical transfer electrode above the lead part of the first-layer vertical transfer electrode; and forming the photoelectric conversion region by performing ion implantation with an impurity having an opposite conductivity type to the conductivity type of the semiconductor substrate at a prescribed dose using the lead part of the first-layer vertical transfer electrode and the lead part of the second-layer vertical transfer electrode as a mask.

According to still another aspect of the invention, in a method for driving the solid-state imaging device, for transferring a signal charge from a photoelectric conversion region to a vertical transfer CCD region, a read out pulse is applied to a second-layer vertical transfer electrode of a vertical transfer electrode having a two-layer structure having lead parts located between photoelectric conversion regions belonging to different pixel areas and to a first-layer vertical transfer electrode and a second-layer vertical transfer electrode of a vertical transfer electrode having a two-layer structure having lead parts located above the photoelectric conversion region of the above-described pixel area.

Thus, the invention described herein makes possible the advantages of providing a progressive-scan CCD solid-state imaging device for realizing a four-phase driving system with a two-layer gate structure, and methods for producing and driving the same.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Example 1

Figure 1:
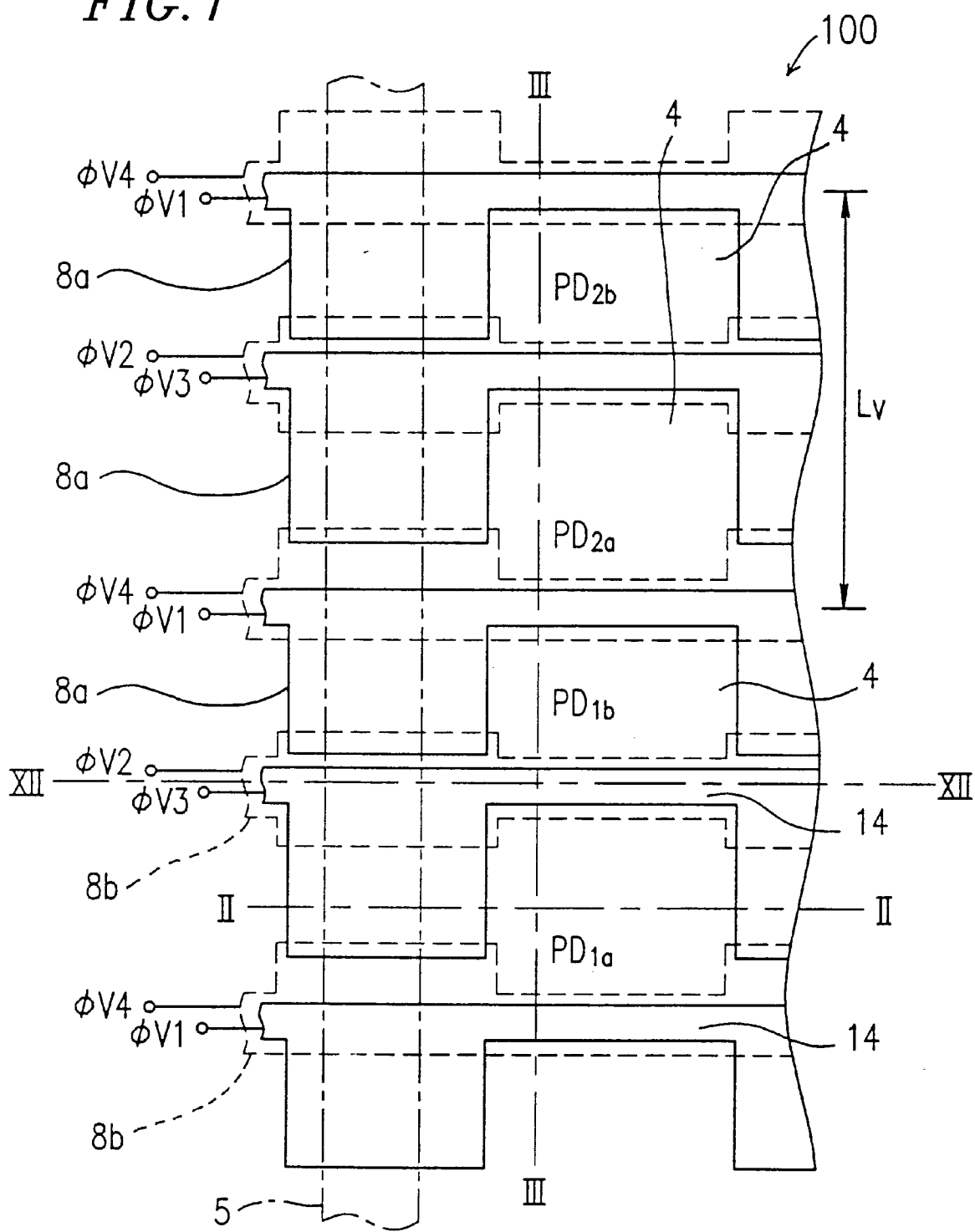
FIG. 1 is a plan view of a CCD solid-state imaging device in a first example according to the present invention.
Figure 2:
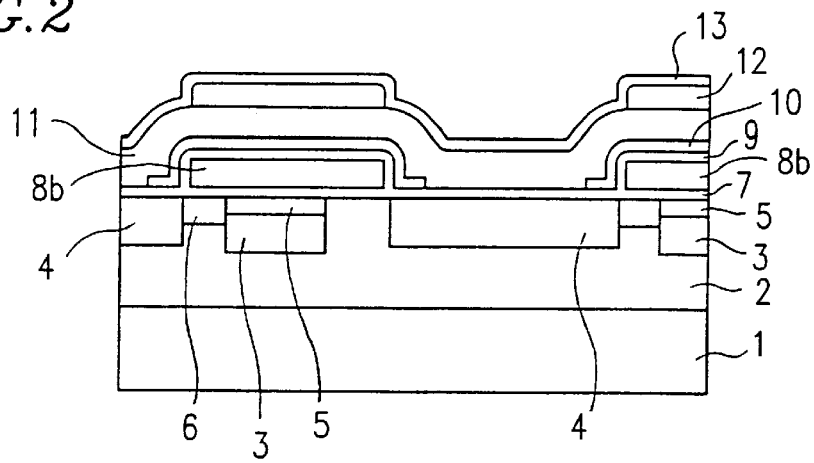
FIG. 2 is a cross-sectional view of the CCD solid-state imaging device shown in FIG. 1 taken along line II—II.
Figure 3:
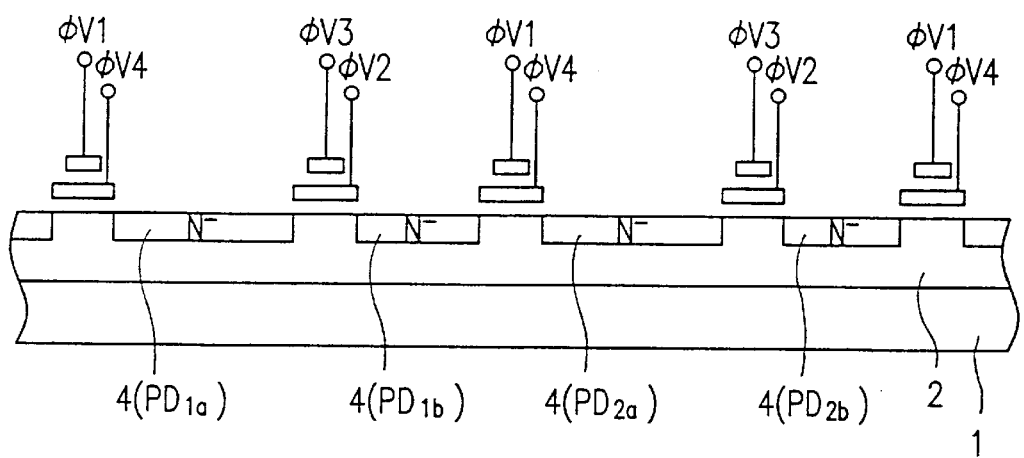
FIG. 3 is a cross-sectional view of the CCD solid-state imaging device shown in FIG. 1 taken along line III—III.

FIG. 1 is a plan view of a progressive-scan CCD solid-state imaging device 100 (hereinafter, referred to simply as the "CCD solid-state imaging device") in a first example according to the present invention. FIG. 2 is a cross-sectional view of the CCD solid-state imaging device 100 taken along line II—II in FIG. 1. FIG. 3 is a cross-sectional view of the CCD solid-state imaging device 100 taken along line III—III in FIG. 1; and FIG. 12 is a cross-sectional view of the CCD solid-state imaging device 100 taken along line XII—XII in FIG. 1.

As shown in FIGS. 1, 2, 3 and 12, an n-type semiconductor substrate 1 has p-type well layers 2 and 3 formed thereon. A vertical transfer CCD region 5 formed of an n-well layer, an isolation layer 6 formed of a p$^+$-type impurity layer, and photoelectric conversion regions 4 ($PD_{1a}$, $PD_{1b}$, $PD_{2a}$ and $PD_{2b}$) which are each formed of an n-type impurity layer are formed on the p-well layer 2 or 3.

A first polysilicon gate electrode 8a is formed with a gate insulation layer 7 over the vertical transfer CCD region 5. As shown in FIG. 12, a first interlevel insulation layer 9 formed of a thermal oxide film or a CVD oxide film is formed on the first polysilicon gate electrode 8a, and a second polysilicon gate electrode 8b is provided on the first interlevel insulation layer 9. The first and second polysilicon gate electrodes 8a and 8b act as four-phase vertical transfer electrodes $\phi_{v1}$ (8b), $\phi_{v2}$ (8a), $\phi_{v3}$ (8b) and $\phi_{v4}$ (8a).

Figure 12:
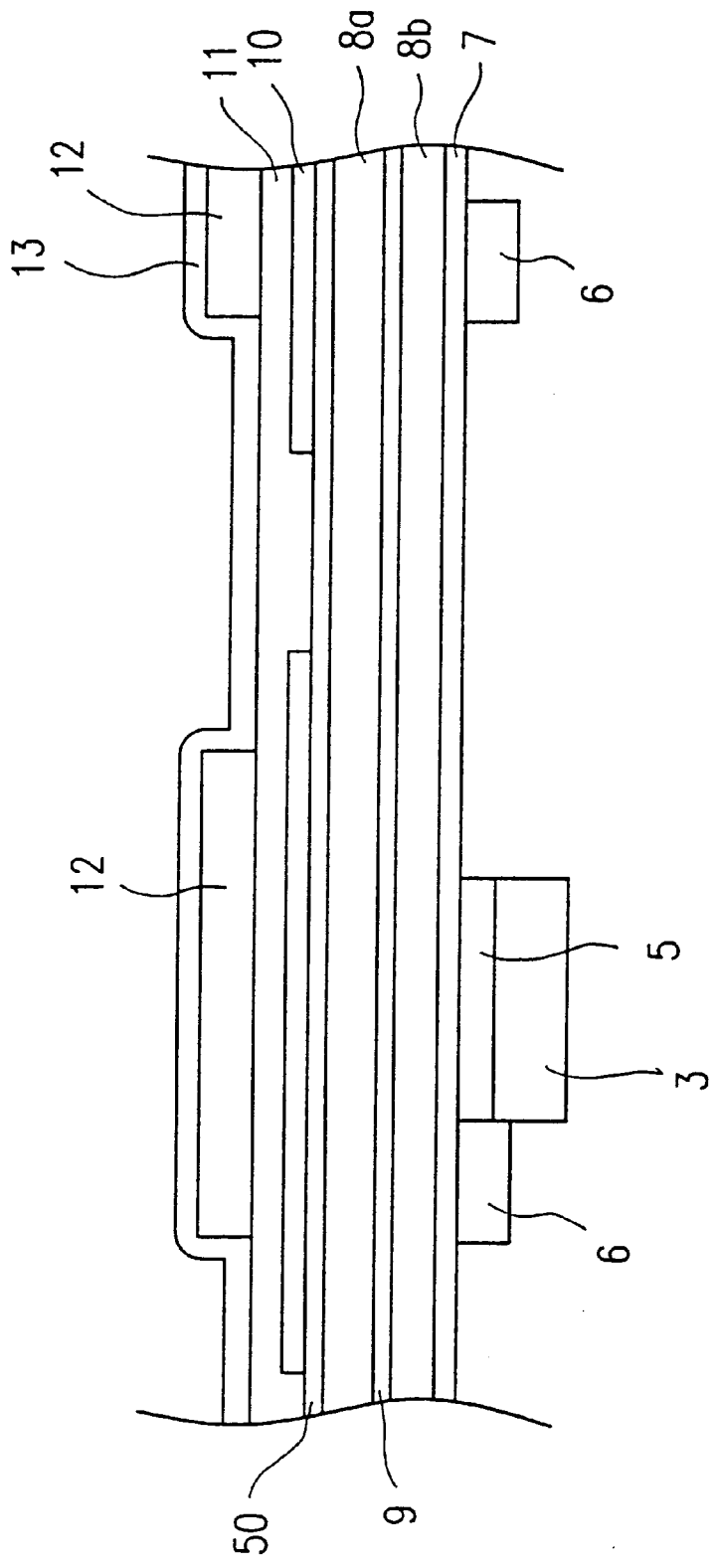
FIG. 12 is a cross-sectional view of the CCD solid-state imaging device shown in FIG. 1 taken along line XII—XII.

As shown in FIG. 12, a second interlevel insulation layer 50 formed of a thermal oxide film or a CVD oxide film is provided on the first polysilicon gate electrode 8a. A first light blocking layer 10 is formed on an area of the second interlevel insulation layer 50 in order to cover the vertical transfer CCD region 5.

A second light blocking layer 12 is formed over the first light blocking layer 10 with a third interlevel insulation layer 11 formed of a CVD oxide film disposed therebetween. At a final stage of production, a surface protection layer 13 formed of a CVD oxide film is formed over the entire surface of the produced structure.

Figure 13:
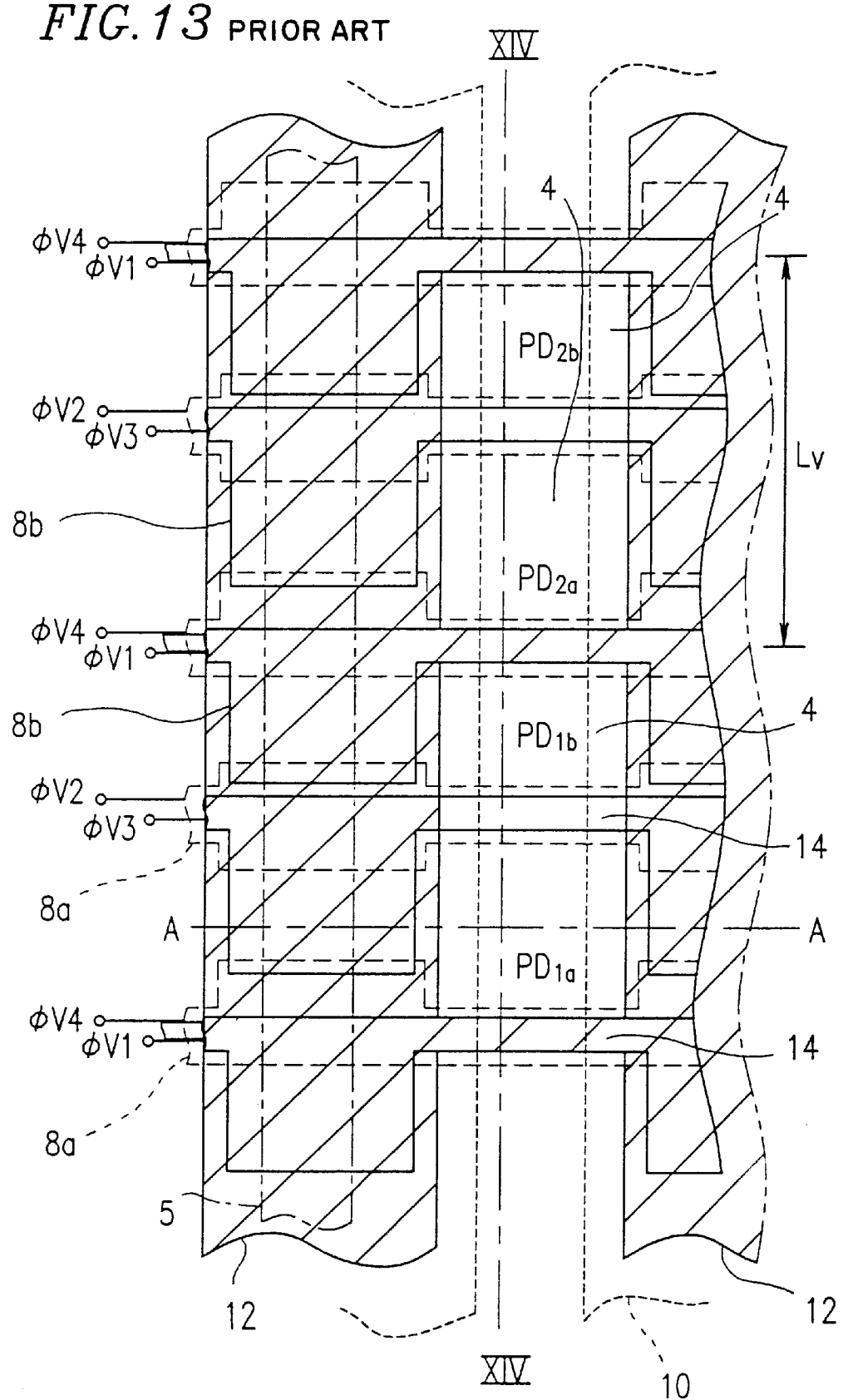
FIG. 13 is a plan view of a CCD solid-state imaging device in a modification of the second example according to the present invention.
Figure 14:
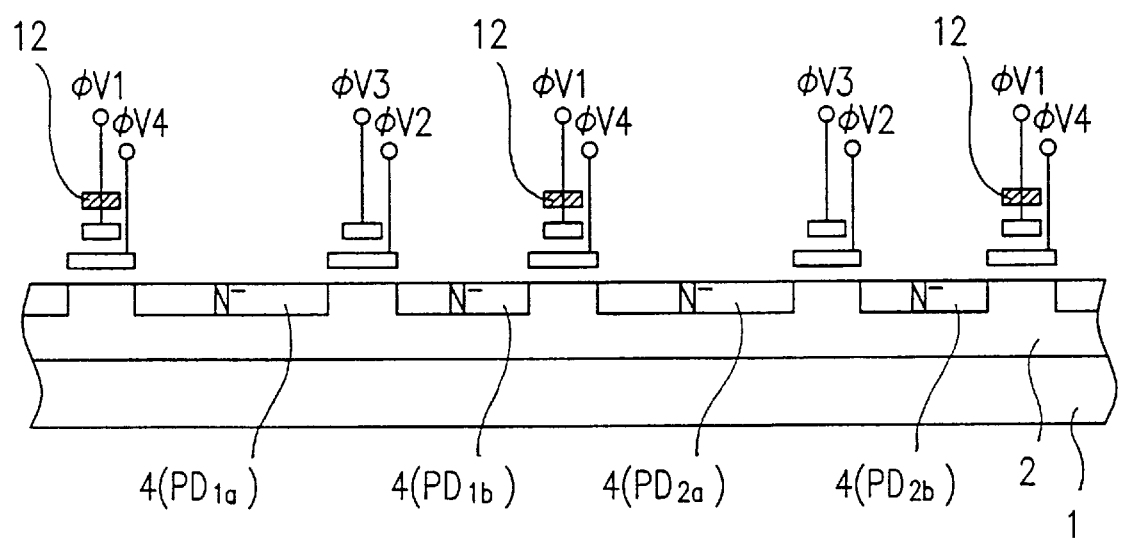
FIG. 14 is a cross-sectional view of the CCD solid-state imaging device shown in FIG. 13 taken along line XIV—XIV.

Alternatively, the first light blocking layer 10 or the second light blocking layer 12 can cover a part of each photoelectric conversion region 4. In another alternative embodiment, both the first and second light blocking layers 10 and 12 can cover a part of each photoelectric conversion region 4. As shown in FIGS. 13 and 14, the second light blocking layer 12 can be formed to cover a part of the electrode lead part 14 of the vertical transfer electrode at an arbitrary pitch, for example, a vertical pixel pitch Lv. In other words, the second light blocking layer 12 can be formed on every other electrode lead part 14 in a unit pixel area. FIG. 13 is a plan view of the CCD solid-state imaging device in which the second light blocking layer 12 covers a part of each photoelectric conversion region 4. FIG. 14 is a cross-sectional view of the CCD solid-state imaging device shown in FIG. 13 taken along line XIV—XIV.

In the solid-state imaging device in FIG. 13, the second light blocking layer 12 is formed on every other electrode lead part 14 in a unit pixel area. Alternatively, the first light blocking layer 10 can be formed on every other electrode lead part 14 in a unit pixel area; or both the first and second light blocking layers 10 and 12 can be formed on every other electrode lead part 14 in a unit pixel area.

In FIGS. 1 through 7 and FIGS. 12 through 14, the symbol Lv represents a vertical pixel pitch, reference numeral 4 represents an n-type impurity region, reference numeral 4a represents a first n-type impurity layer which is a photoelectric conversion region, and reference numeral 4b represents a second n-type impurity layer which also is a photoelectric conversion region. In addition, reference numeral 14 represents a lead part of the vertical transfer electrode, reference numeral 15 represents a signal charge, reference numerals 16a and 16b represent photoresists, and reference numeral 17 represents a potential well.

In the first example according to the present invention, as shown in FIG. 1, the lead parts of the electrodes $\phi_{v2}$ and $\phi_{v3}$ of the four-phase electrodes are connected to the adjacent vertical transfer electrodes. Thus, one bit of the vertical transfer CCD region 5 is formed in a horizontal direction in the vicinity of the center of the photoelectric conversion region 4 which is conventionally one continuous region.

Figure 9A:
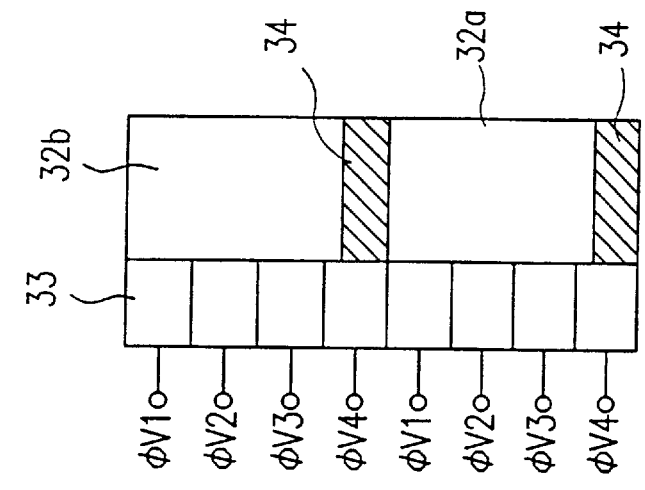
FIG. 9A is a structural view of a pixel section of a conventional CCD solid-state imaging device having a two-layer gate structure which is driven by a two-phase driving system.
Figure 9B:
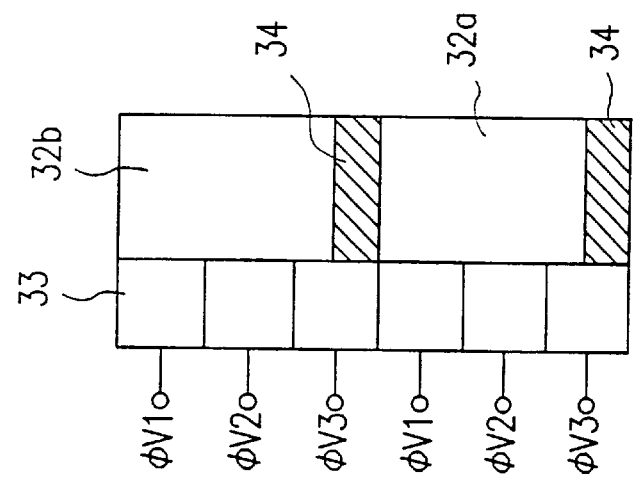
FIG. 9B is a structural view of a pixel section of a conventional CCD solid-state imaging device having a three-layer gate structure which is driven by a three-phase driving system.
Figure 9C:
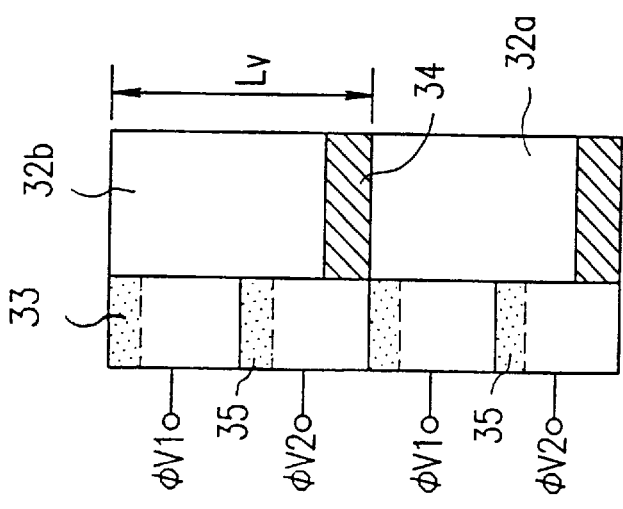
FIG. 9C is a structural view of a pixel section of a conventional CCD solid-state imaging device having a three-layer gate structure which is driven by a four-phase driving system.
Figure 10A:
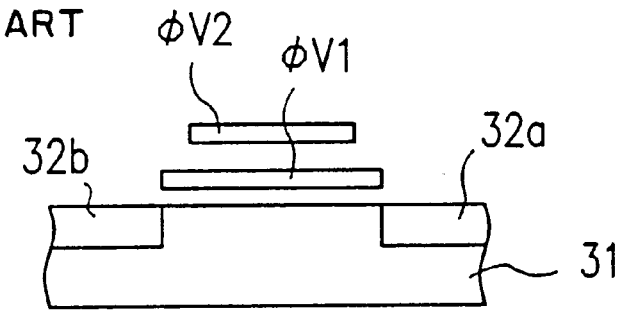
FIG. 10A is a cross-sectional view of a lead part of a vertical transfer electrode in the CCD solid-state imaging device shown in FIG. 9A.
Figure 10B:
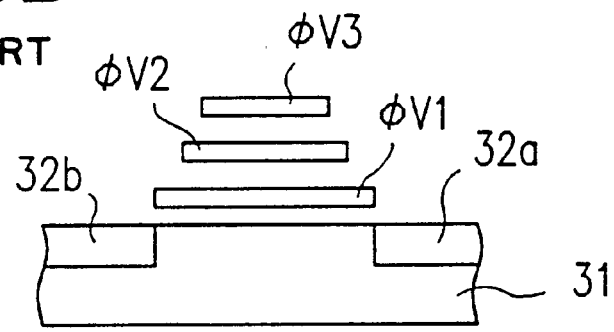
FIG. 10B is a cross-sectional view of a lead part of a vertical transfer electrode in the CCD solid-state imaging device shown in FIG. 9B.
Figure 10C:
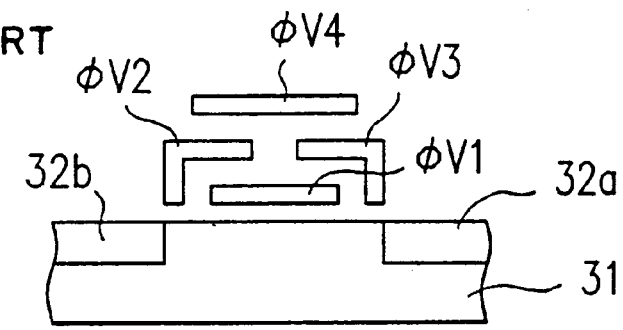
FIG. 10C is a cross-sectional view of a lead part of a vertical transfer electrode in the CCD solid-state imaging device shown in FIG. 9C.
Figure 11A:
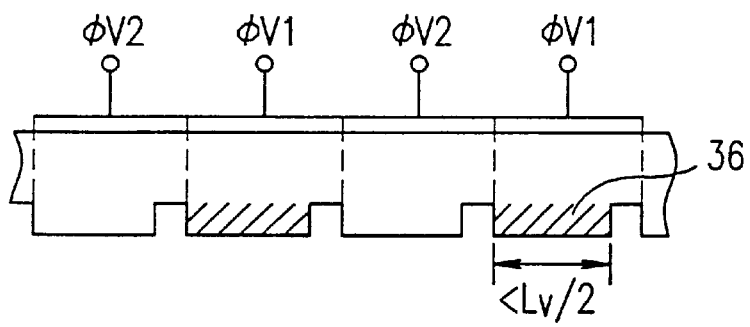
FIG. 11A is a diagram illustrating a potential profile in a vertical transfer CCD region shown in FIG. 10A.
Figure 11B:
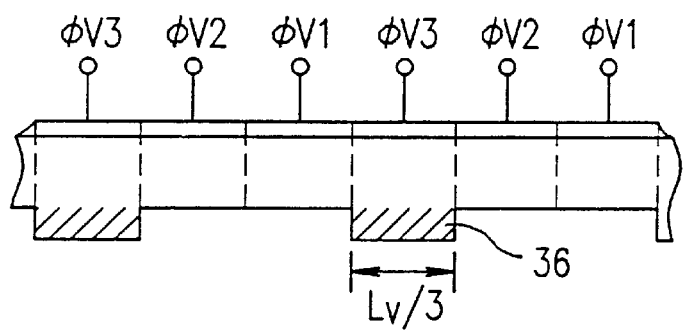
FIG. 11B is a diagram illustrating a potential profile in a vertical transfer CCD region shown in FIG. 10B.
Figure 11C:
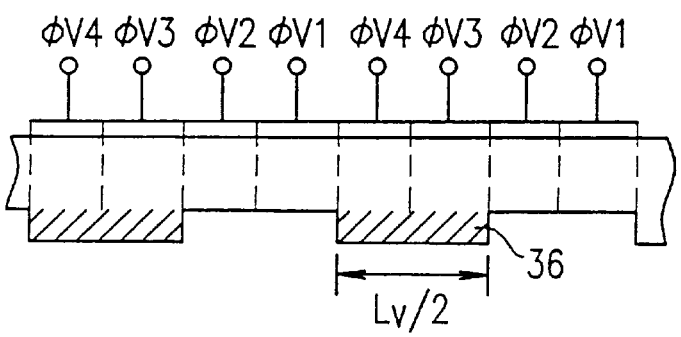
FIG. 11C is a diagram illustrating a potential profile in a vertical transfer CCD region shown in FIG. 10C.

The photoelectric conversion region 32a (or 32b) shown in FIGS. 9A, 9B and 9C illustrating the conventional technology is divided into two regions $PD_{1a}$ and $PD_{1b}$ or $PD_{2a}$ and $PD_{2b}$. The four-phase vertical transfer electrodes $\phi_{v1}$, $\phi_{v2}$, $\phi_{v3}$ and $\phi_{v4}$ corresponding to one bit are provided in a unit pixel area including $PD_{1a}$ and $PD_{1b}$ or $PD_{2a}$ and $PD_{2b}$. Accordingly, the signal charge photoelectrically converted in each photoelectric conversion region is transferred through the vertical transfer CCD region 5 independently without being mixed with the signal charges in the vertically adjacent unit areas and thus is output as a signal converted into a voltage corresponding to the charge amount by the output circuit provided at the end of the horizontal transfer CCD section (not shown).

Figure 4:
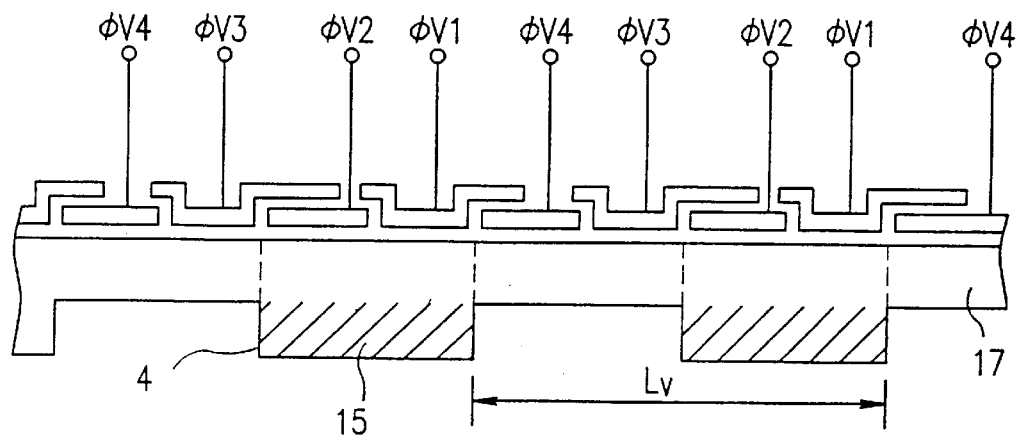
FIG. 4 is a schematic diagram showing a potential profile of the CCD solid-state imaging device shown in FIG. 1 in the state when signal charges are transferred.

Moreover, the four-phase vertical transfer electrodes $\phi_{v1}$, $\phi_{v2}$, $\phi_{v3}$ and $\phi_{v4}$ are located within the unit pixel pitch Lv in the vertical direction in correspondence with a one-bit area of the vertical transfer CCD region 5. Accordingly, when the signal charge is transferred through the vertical transfer CCD region 5, the signal charge storage area can be as large as Lv/2 as shown in FIG. 4. The utilization efficiency in this case is 1.5 times the utilization efficiency of the conventional progressive-scan CCD solid-state imaging device driven by the three-phase driving system with the three-layer gate structure, in which the signal charge storage area is Lv/3.

By arranging the above-described unit pixel areas two-dimensionally, specifically by vertically arranging the number of unit pixel areas corresponding to the number of scan lines of the display screen for which the use of the CCD solid-state imaging device is intended, a progressive-scan CCD solid-state imaging device can be obtained for transferring information simultaneously read from all the pixels without mixing and outputting video signals which can be displayed in the entire display area.

The photoelectric conversion regions 4 in one pixel area need not be separated to have an equal size by the lead part 14 of the vertical transfer electrode. However, in the case where the photoelectric conversion regions 4 have an equal size, the charge amounts stored in the photoelectric conversion regions 4 are equal, which increases the dynamic range.

In the first example according to the present invention, as shown in FIG. 3, the n⁻-type impurity layers of the photoelectric conversion regions 4 ($PD_{1a}$, $PD_{1b}$, $PD_{2a}$ and $PD_{2b}$) are also formed under the vertical transfer electrodes $\phi_{v2}$ and $\phi_{v3}$. Such a structure is advantageous for increasing the amount of the signal charges since the areas covered by the vertical transfer electrodes $\phi_{v2}$ and $\phi_{v3}$ also contribute to the storage of the signal charges.

However, the structure of the first example, the n⁻-type impurity layers of the photoelectric conversion regions 4 are formed before the vertical transfer electrodes are formed. Accordingly, it is undesirably expected that the n⁻-type impurity layers are positionally offset with respect to the lead parts of the vertical transfer electrodes which will be formed later. In consideration of the margin for alignment with the mask, the effective area contributing to the photoelectric conversion and storage of the signal charges in the unit pixel area having a limited a area is reduced.

Example 2

Figure 5A:
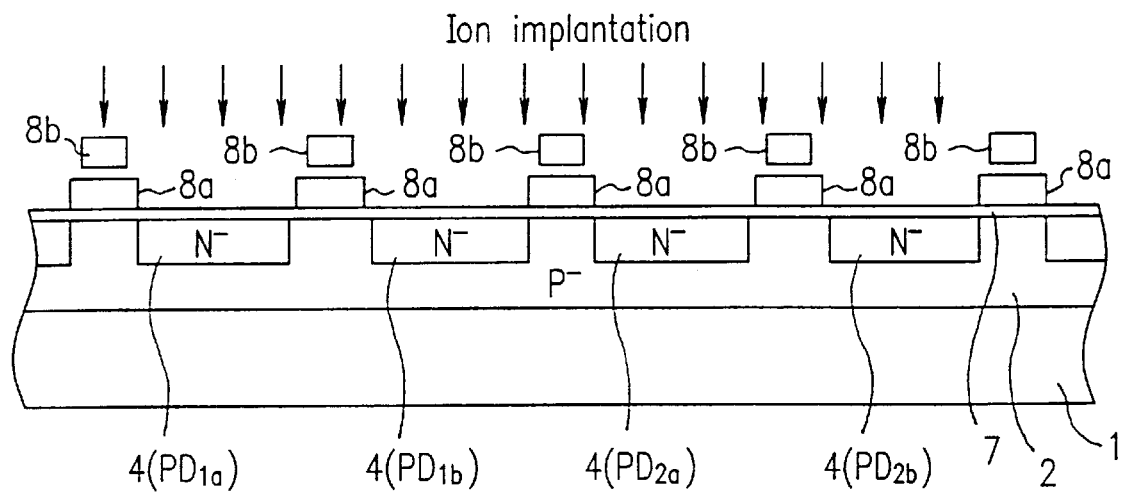
FIGS. 5A and 5B are cross-sectional views showing production steps of a CCD solid-state imaging device in a second example according to the present invention taken in a line corresponding to line III—III in FIG. 1.
Figure 5B:
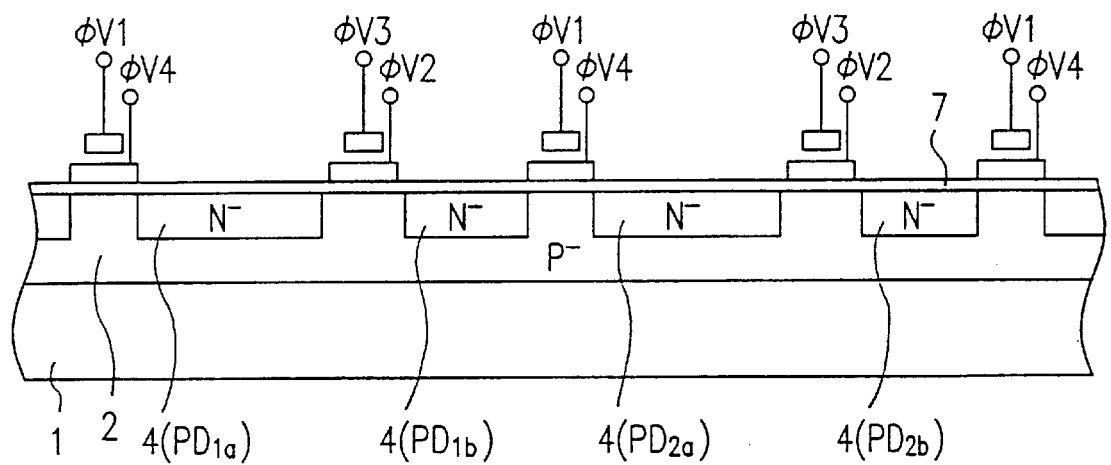

In order to avoid such positional offset, as in a second example shown in FIGS. 5A and 5B, the n⁻-type impurity layers of the photoelectric conversion regions 4 can be formed after the formation of the vertical transfer electrodes by ion implantation using the lead parts of the vertical transfer electrodes as a mask.

Example 3

Moreover, a third example can be used in which the methods shown in the first and second examples are combined.

Hereinafter, with reference to FIGS. 6A, 6B, 6C, 7A, 7B, and 7C, a method for producing a CCD solid-state imaging device in a third example according to the present invention will be described.

First, on an n-type semiconductor substrate 1, a p-well layer 2 is formed. On the p-well layer 2, a vertical transfer CCD region 5 formed of an n-well layer and an isolation layer 6 formed of a p⁺-type impurity layer are formed. On the p-well layer 2, a gate insulation layer 7 is also formed. Next, a resist pattern 16b having photoresist removed in an area corresponding to an area where a photoelectric conversion region will be provided is formed, with the gate insulation layer 7 disposed therebetween. The resist is patterned so that the location of the end of the resist pattern 16b is closer to the area where the photoelectric conversion region is to be formed than the location of the edge of the n-type impurity region 4b which will be formed by ion implantation using the lead parts of the vertical transfer electrodes as a mask after the gate electrode is formed.

Figure 6A:
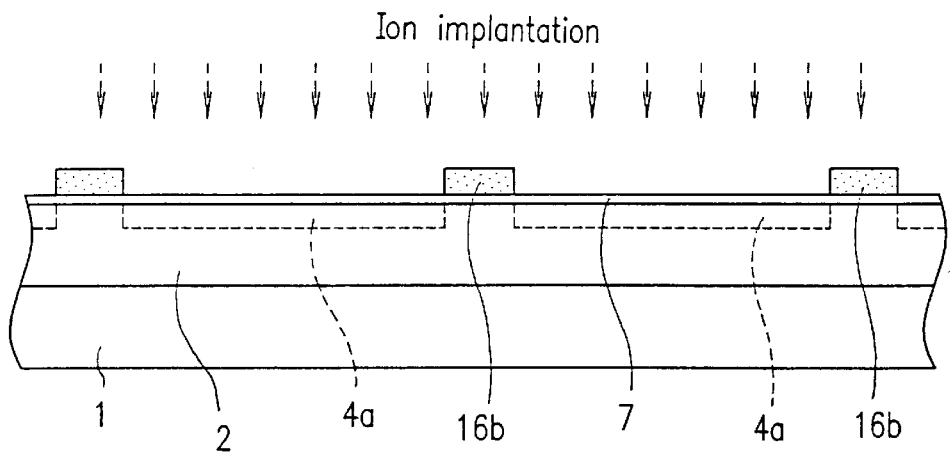
FIGS. 6A, 6B and 6C are cross-sectional views showing production steps of a CCD solid-state imaging device in a third example according to the present invention taken in a first direction.
Figure 7A:
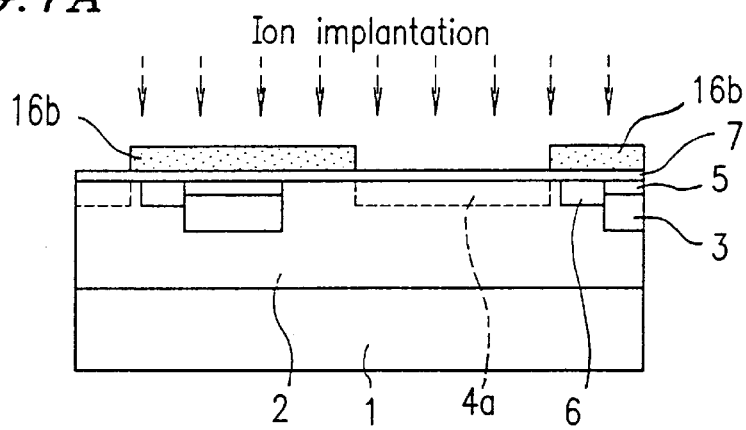
FIGS. 7A, 7B and 7C are cross-sectional views showing production steps of the CCD solid-state imaging device shown in FIGS. 6A, 6B and 6C taken in a second direction perpendicular to the first direction.

Then, a first ion implantation of phosphorus as an n-type impurity is performed at an acceleration energy of about 200 to 400 keV and a dose of about $10^{11}$ to $10^{13}$ cm⁻², using the photoresist pattern 16a as a mask, thereby forming first n-type impurity regions 4a which are smaller than the areas which will comprise the photoelectric conversion regions 4 (FIGS. 6A and 7A).

Figure 6B:
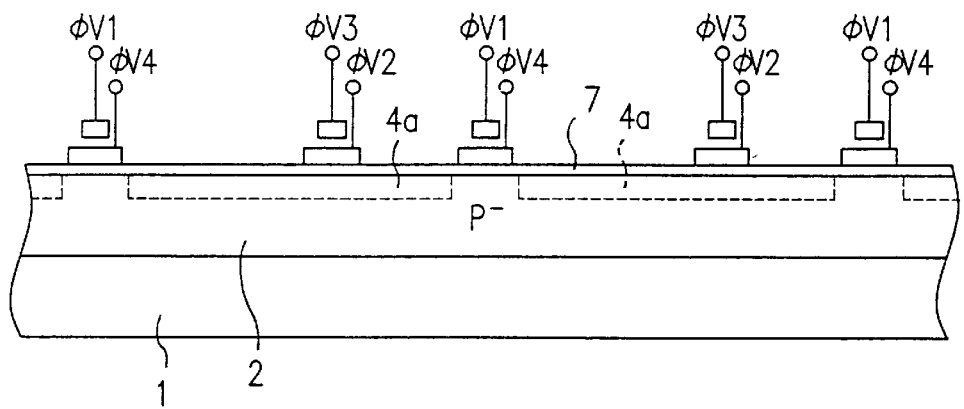
Figure 6C:
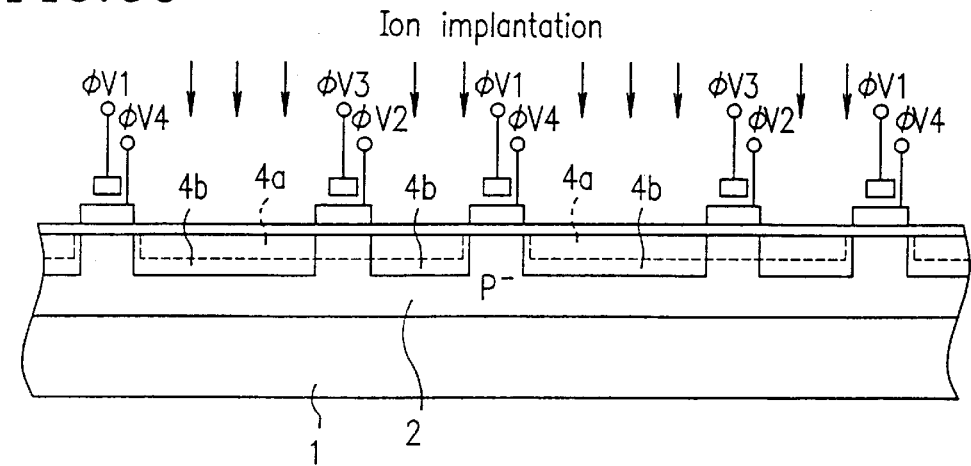
Figure 7B:
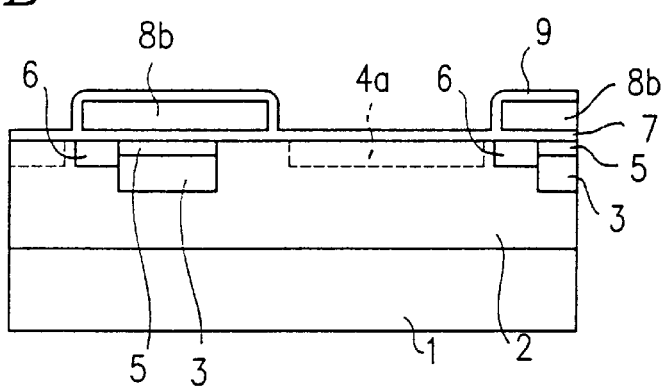
Figure 7C:
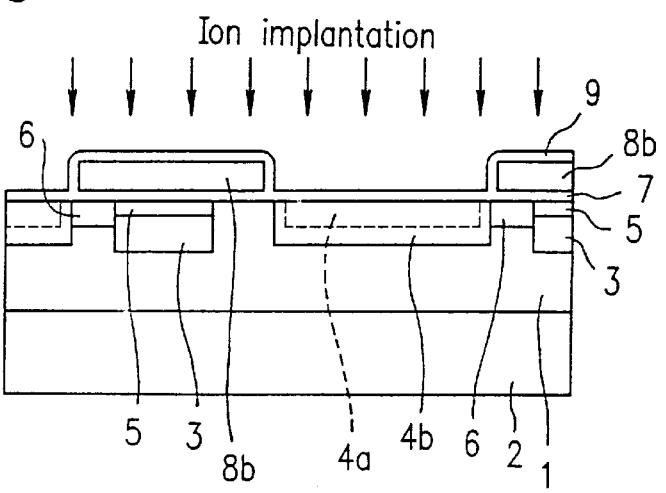

Next, a polysilicon film having a thickness of about 500 nm is formed and treated by photo-etching, thereby forming vertical transfer electrodes $\phi_{v2}$ and $\phi_{v4}$. Then, after a silicon oxide film is formed to a thickness of about 150 nm over the entire surface of the semiconductor substrate 1, a polysilicon film having a thickness of about 500 nm is formed and treated by photo-etching, thereby forming vertical transfer electrodes $\phi_{v1}$ and $\phi_{v3}$ (FIGS. 6B and 7B).

Then, a second ion implantation of phosphorus as an n-type impurity is performed at an acceleration energy of about 200 to 400 keV and a dose of about $10^{11}$ to $10^{13}$ cm⁻², using the vertical transfer electrodes $\phi_{v1}$, $\phi_{v2}$, $\phi_{v3}$ and $\phi_{v4}$ as a mask, thereby forming second n-type impurity regions 4b. The first and second n-type impurity regions 4a and 4b form the photoelectric conversion regions 4.

The dose of each of the first and second ion implantations is determined so that the total concentration of the n-type impurity regions 4a and 4b is the intended concentration. Although the first and second n-type impurity regions 4a and 4b have different depths in FIGS. 6C and 7C, the two impurity regions 4a and 4b can have the same depth. In addition, the concentrations of the n-type impurity regions 4a and 4b can be equal to each other or different from each other.

Figure 8A:
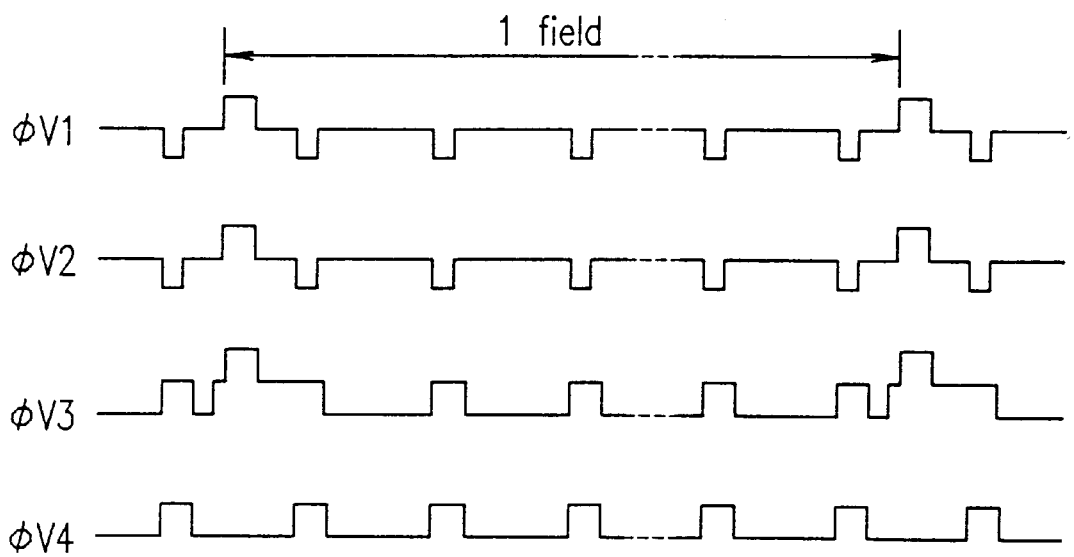
FIG. 8A is a timing diagram for driving a CCD solid-state imaging device according to the present invention.

In the CCD solid-state imaging devices (described in the first, second and third examples according to the present invention) for reading the signal charge stored in each photoelectric conversion region 4 to the vertical transfer CCD region 5, a read out pulse, usually having an amplitude of about 15 V (0 through 15 V), is applied to three-phase electrodes ($\phi_{v1}$, $\phi_{v2}$ and $\phi_{v3}$) out of the four-phase electrodes as shown in the timing diagram of FIG. 8A. The above-mentioned read out pulse is not applied to one-phase electrode ($\phi_{v4}$) which is formed between different photoelectric conversion regions which are adjacent to each other (for example, $PD_{2a}$ and $PD_{1b}$ in FIG. 1).

Figure 8B:
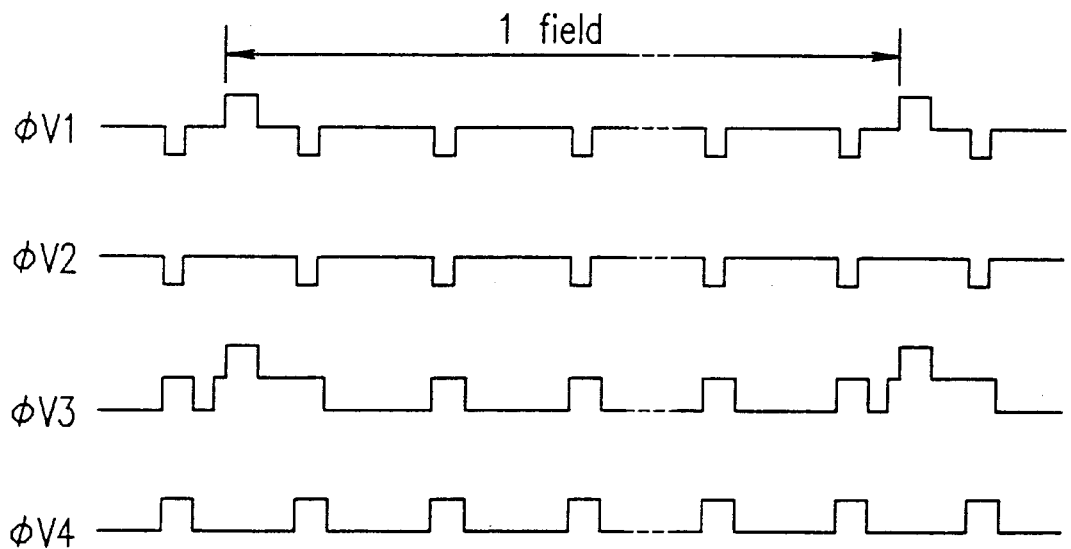
FIG. 8B is a timing diagram showing another manner of driving the CCD solid-state imaging device.

In the structure of the pixel area of a progressive-scan CCD solid-state imaging device according to the present invention, the photoelectric conversion regions 4 in a unit pixel pitch are separated from each other by a lead part 14 of the vertical transfer electrode. Accordingly, in the case where the reading method using the conventional timing as shown in FIG. 8B (by which a read out pulse is applied only to the second-layer polysilicon gate electrode 8b (electrodes $\phi_{v1}$ and $\phi_{v3}$ in the first through third examples) is used for reading the signal charge from the photoelectric conversion regions 4 to the vertical transfer CCD region 5, the channel region is excessively narrow. Accordingly, it is undesirably expected that the amplitude of the read out pulse required for completely reading the signal charges stored in the photoelectric conversion regions 4 will be raised. In order to avoid this, the progressive-scan CCD solid-state imaging device according to the present invention is driven by applying the read out pulse to the electrode $\phi_{v4}$ simultaneously to the electrode $\phi_{v1}$ and $\phi_{v3}$.

By such a system, the channel width for read out can be wide, and thus the rise in the amplitude of the pulse required for completely reading the charges can be reduced. In other words, in the first through third examples, when the signal charges are transferred from the photoelectric conversion regions 4 to the vertical transfer CCD region 5, a read out pulse is applied to the second-layer vertical transfer electrode (electrode $\phi_{v1}$) among a vertical transfer electrode having a two-layer structure (electrodes $\phi_{v1}$ and $\phi_{v4}$) having the lead parts 14 located between the photoelectric conversion regions 4 belonging to different pixel areas and also to a vertical transfer electrode having a two-layer structure (electrodes $\phi_{v2}$ and $\phi_{v3}$) having the lead parts 14 above the photoelectric conversion region 4 of the above-described pixel area.

In the examples according to the present invention, the areas which conventionally act as photoelectric conversion regions are partially covered by the lead parts 14 of the vertical transfer electrodes of the vertical transfer CCD region 5. The reduction in the area of the photoelectric conversion regions 4 due to such a structure can be compensated for by enlarging the areas of the photoelectric conversion regions 4 in the horizontal direction since the channel width of the vertical transfer CCD region can be reduced as described above.

As described above in detail, the present invention provides a progressive-scan CCD solid-state imaging device without specifically changing the production process of a two-layer gate structure which is suitable for the production of an inter-line transfer-type CCD solid-state imaging device conventionally used for video cameras. Since the production of a two-layer gate structure is possible without adding any ion implantation step, the production is not complicated and an excessively large stepped part on the surface of the pixel section is avoided.

The signal charge storage region of the vertical transfer CCD region can be utilized in the vertical direction up to ½ of the vertical pixel pitch Lv, which is 1.5 times Lv/3 in the case of the three-layer, three-phase driving system. Accordingly, the channel width of the vertical transfer CCD section required for storing and transferring the same amount of signal charges can be narrowed compared to the case of the three-layer, three-phase driving system.

According to the present invention, the areas which conventionally act as photoelectric conversion regions are partially covered by the lead parts of the vertical transfer electrodes of the vertical transfer CCD region. The reduction in the area of the photoelectric conversion regions due to such a structure can be compensated for by enlarging the areas of the photoelectric conversion regions 4 in the horizontal direction since the channel width can be reduced as described above.

In one embodiment of the invention, even the area covered by the lead part of the electrode can be used for storage of signal charges. Accordingly, the amount of the converted signal charges which can be stored is increased.

In one embodiment of the invention, a sufficient margin for positional offset of the photoelectric conversion region and the signal charge reading electrode can be guaranteed.

In one embodiment of the invention, the effective channel width through which the charges pass when the charges are read out from the photoelectric conversion region to the vertical transfer CCD region is enlarged. Accordingly, increase in the amplitude of the pulse required for reading the charges can be avoided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state imaging device having a progressive-scan structure, and comprising, in a unit pixel area of a semiconductor substrate, a photoelectric conversion region and a vertical transfer CCD region for reading and transferring a signal charge stored in the photoelectric conversion region by performing four-phase driving using two vertical transfer electrodes each having a two layer structure formed over the semiconductor substrate with a gate insulation layer disposed therebetween, wherein, among the two vertical transfer electrodes each having a two-layer structure and lead parts, lead parts of one vertical transfer electrode having the two-layer structure are positioned on the photoelectric conversion region in the unit area, and wherein the photoelectric conversion region in one pixel area is partially covered by the lead part of the vertical electrode of the vertical transfer CCD region.

2. A solid-state imaging device according to claim 1, wherein a part covered by the lead part of the vertical transfer electrode positioned on the photoelectric conversion region is formed to have an opposite conductivity type to the conductivity type of an impurity layer which is not covered by the lead part of the electrode.

3. A solid-state imaging device according to claim 1, wherein a light blocking layer is formed periodically over at least one of the two vertical transfer electrodes each having the two-layer structure in the unit pixel area.

4. A method for producing a solid-state imaging device according to claim 1, comprising the steps of:

forming a vertical transfer CCD region, an isolation region and a gate insulation layer in a semiconductor substrate, and then forming a photoelectric conversion region by performing ion implantation with an impurity having an opposite conductivity type to the conductivity type of the semiconductor substrate selectively into an area to be the photoelectric conversion region at a prescribed dose;

forming a first-layer vertical transfer electrode including a lead part so that the lead part covers a part of the photoelectric conversion region; and forming a second-layer vertical transfer electrode above the lead part of the first-layer vertical transfer electrode after forming an insulation layer over the entire surface of the semiconductor substrate.

5. A method for producing a solid-state imaging device according to claim 2, comprising the steps of:

forming a vertical transfer CCD region, an isolation region and a gate insulation layer in a semiconductor substrate, and then forming a first-layer vertical transfer electrode covering a part of an area to be a photoelectric conversion region;

forming a lead part of a second-layer vertical transfer electrode above the lead part of the first-layer vertical transfer electrode after forming an insulation layer over the entire surface of the semiconductor substrate; and forming a photoelectric conversion region by performing ion implantation with an impurity having an opposite conductivity type to the conductivity type of the semiconductor substrate at a prescribed dose using the lead part of the first-layer vertical transfer electrode and the lead part of the second-layer vertical transfer electrode as a mask.

6. A method for producing a solid-state imaging device according to claim 1, comprising the steps of:

forming a vertical transfer CCD region, an isolation region and a gate insulation layer in a semiconductor substrate, then forming a resist pattern so that the location of an end thereof is closer to a first area than the location of a border between the first area to be a photoelectric conversion region and a second area where a first-layer vertical transfer electrode is to be formed so that the resist pattern covers the second area entirely, and forming a first impurity region by performing ion implantation with an impurity having an opposite conductivity type to the conductivity type of the semiconductor substrate at a prescribed dose using the resist pattern as a mask;

forming a first-layer vertical transfer electrode including a lead part so that the lead part covers a part of the photoelectric conversion region, and then forming a lead part of a second-layer vertical transfer electrode above the lead part of the first-layer vertical transfer electrode; and forming the photoelectric conversion region by performing ion implantation with an impurity having an opposite conductivity type to the conductivity type of the semiconductor substrate at a prescribed dose using the lead part of the first-layer vertical transfer electrode and the lead part of the second-layer vertical transfer electrode as a mask.

7. A method for driving a solid-state imaging device according to claim 1, wherein, for transferring a signal charge from a photoelectric conversion region to a vertical transfer CCD region, a read out pulse is applied to a second-layer vertical transfer electrode of a vertical transfer electrode having a two-layer structure having lead parts located between photoelectric conversion regions belonging to different pixel areas and to a first-layer vertical transfer electrode and a second-layer vertical transfer electrode of a vertical transfer electrode having a two-layer structure having lead parts located above the photoelectric conversion region of the above-described pixel area.

* * * * *